(12) United States Patent
Ishii et al.

(10) Patent No.: US 6,177,231 B1
(45) Date of Patent: Jan. 23, 2001

(54) RESIST MATERIAL AND FABRICATION METHOD THEREOF

(75) Inventors: Tetsuyoshi Ishii, Isehara; Toshiaki Tamamura, Atsugi; Hiroshi Nozawa, Zama; Kenji Kurihara, Hiratsuka, all of (JP)

(73) Assignee: Nippon Telegraph and Telephone Corporation, Tokyo (JP)

( * ) Notice: Under 35 U.S.C. 154(b), the term of this patent shall be extended for 0 days.

(21) Appl. No.: 08/870,273

(22) Filed: Jun. 6, 1997

(30) Foreign Application Priority Data

| Jun. 7, 1996 | (JP) | 8-166607 |
| Aug. 27, 1996 | (JP) | 8-242560 |
| Feb. 7, 1997 | (JP) | 9-038538 |

(51) Int. Cl.$^7$ .................................. B32B 27/14
(52) U.S. Cl. ............................ 430/273.1; 430/271.1; 430/156; 216/16; 216/47; 216/51; 216/49; 427/903; 428/323; 428/413; 428/500; 428/913; 524/495; 524/496; 524/847; 524/905; 438/763
(58) Field of Search ........................... 524/495, 496, 524/847, 905; 430/273.1, 271.1, 156; 427/903; 428/323, 413, 500, 523, 913; 438/763; 216/16, 47, 49, 51

(56) References Cited

U.S. PATENT DOCUMENTS

| 5,281,653 | * | 1/1994 | Thomann et al. | 524/490 |
| 5,296,536 | * | 3/1994 | Bartholemew | 524/495 |
| 5,453,413 |   | 9/1995 | Eklund | 502/416 |
| 5,561,026 | * | 10/1996 | Aoki | 430/196 |
| 5,648,056 | * | 7/1997 | Tanaka | 423/445 B |
| 5,759,725 | * | 6/1998 | Hirao et al. | 430/58 |
| 6,077,401 | * | 6/2000 | Fields et al. | 204/157.47 |

FOREIGN PATENT DOCUMENTS

| 43 21 547 |   | 1/1994 | (DE) . |
| 60-157291 |   | 8/1985 | (JP) . |
| 6-61138 | * | 3/1994 | (JP) . |
| 6-167812 |   | 6/1994 | (JP) . |
| 6-242543 |   | 9/1994 | (JP) . |
| 07033751 | * | 2/1995 | (JP) . |
| 7-134413 |   | 5/1995 | (JP) . |
| 07134413 | * | 5/1995 | (JP) . |

OTHER PUBLICATIONS

Ishii et al., Nanocomposite resist system, Appl. Phys. Lett. 70(9), pp. 1110–1112, Mar. 1997.*
Iijima, S., The 60–carbon cluster has been revealed, J. Phys. Chem. vol. 91, pp. 3466–3467, 1987.*
Ebert, L., Is soot composed predominantly of carbon clusters?, Science vol. 247, pp. 1468–1471, Mar. 1990.*
Chang, R., Chemistry, Third Edition, McGraw–Hill Publishing, p. 74, 1988.*
Chen et al., "Fabrication of 5–7 nm Wide Etched Lines in Silicon Using 100 keV Electron–Beam Lithography and Polymethylmethacrylate Resist," Appl. Phys. Lett., vol. 62, No. 13, Mar. 29, 1993, pp. 1499–1501.
Kurihara et al., "Si Nanostructures Fabricated by Electron Beam Lithography Combined With Image Reversal Process Using Electron Cyclotron Resonance Plasma Oxidation," J. Vac. Sci. Technol. vol. B13, No. 6, Nov/Dec., 1995, pp. 2170–2174.
Kakuchi et al., "Amorphous Carbon Films as Resist Masks With High Reactive Ion Etching Resistance for Nanometer Lithography," Appl. Phys. Lett., vol. 48, No. 13, Mar. 31, 1986, pp. 835–837.
Kagaku Daijiten, Chemical Terms Dictionary, Kyoritsu Shuppan Publishing Co., vol. 5, p. 749, 1981.
Tada et al., "Nonlithography Using Fullerene Films as an Electron Beam Resist," Jpn. J. Appl. Phys., vol. 35, Part 2, No. 1A, Jan. 1, 1996, pp. L63–L65.
Ishii et al., "Nanocomposite Resist System—Enhancements of Resist Performance by $C_{60}$ Incorporation," Proceedings of the '97 Spring Conference of the Japanese Society of Applied Physics, p. 550, Apr. 28, 1997.
Ishii et al., "$C_{60}$–Incorporated Nanocomposite Resist System," Journal of Photopolymer Science and Technology, vol. 10, No. 4, pp. 651–656, 1997.
Ishii et al., "Nanocomposite Resist System," Appl. Phys. Lett., vol. 70, No. 9, pp. 1110–1112, Mar. 3, 1997.
Ishii et al., "A Nano–Composite Resist System: A New Approach to Nanometer Pattern Fabrication," Microelectric Engineering, vol. 35, pp. 113–116, 1997.
Ishii et al., "$C_{60}$–Incorporated Nanocomposite Resist System for Practical Nanometer Pattern Fabrication," Abstract of Int. Conf. on Electron, Ion, and Photon Beam Technology and Nanofabrication (EIPBN) '97, pp. 355–356, May 30, 1997.
Ishii et al., "A Nano–Composite Resist System: A New Approach to Nanometer Pattern Fabrication," Abstract of Micro–& Nano–Engineering (MNE) '96, pp. 21–22, Sep. 23, 1996.

* cited by examiner

Primary Examiner—David W. Wu
Assistant Examiner—R. Rabago
(74) Attorney, Agent, or Firm—Finnegan, Henderson, Farabow, Garrett, & Dunner, L.L.P.

(57) ABSTRACT

A resist material having a resist and particles mixed into the resist, a major component of the particles being a cluster of carbon atoms, is provided. A method for fabricating a resist material is also provided, the method repeatedly performing: a first step of coating a substrate with a resist film; and a second step of depositing particles whose major component is a cluster of carbon atoms on the resist film. Accordingly, a resist film with high etching resistance can be obtained, and it is possible to realize a reduction in the thickness of the resist film, improvements of contrast of resist patterns; resist sensitivity; heat resistance of resist films; mechanical strength of resist patterns; and further, stabilization of resist sensitivity. Therefore, highly precise fine pattern fabrication can be realized.

2 Claims, 10 Drawing Sheets

EXAMPLE OF PATTERN FABRICATION USING RESIST MATERIAL OF EMBODIMENT 1

EXAMPLE OF PATTERN FABRICATION USING CONVENTIONAL RESIST MATERIAL

EXAMPLE SHOWING HEAT RESISTANCE OF RESIST ACCORDING TO THE PRESENT INVENTION (AFTER BAKING AT 150°C FOR 30MIN)

EXAMPLE SHOWING HEAT RESISTANCE OF CONVENTIONAL RESIST (AFTER BAKING AT 150°C FOR 30MIN)

EXAMPLE SHOWING MECHANICAL STRENGTH OF RESIST ACCORDING TO THE PRESENT INVENTION (PATTERN PITCH : 60nm)

EXAMPLE SHOWING MECHANICAL STRENGTH OF CONVENTIONAL RESIST (PATTERN PITCH : 90nm)

RESIST MATERIAL AND FABRICATION METHOD THEREOF

BACKGROUND OF THE INVENTION

1. Field of the Invention

The present invention relates to resist materials for fabricating a fine pattern and fabrication method of a resist material. This application is based on patent applications Nos. Hei 8-166607, Hei 8-242560, and Hei 9-038538 filed in Japan, the contents of which are incorporated herein by reference.

2. Description of the Related Art

Pattern fabrication in relation to semiconductor integrated devices represented by ULSI (Ultra Large Scale Integrated Circuit) is performed such that a thin film layer of a resist material (often abbreviated as a "resist", hereinafter), which is sensitive to high energy beams such as Ultra-violet light (often abbreviated as a "UV", hereinafter), X-ray, or electron beams, is deposited on a semiconductor substrate, and then the resist is irradiated with such high energy beams and is developed.

FIGS. 3A–3B are diagrams for explaining processes for fabricating a pattern using a conventional resist material. In FIGS. 3A–3B, reference numeral 1 indicates a (semiconductor) substrate, reference numeral 2 indicates a resist film, reference numeral 3 indicates high energy beams (such as UV, X-ray, or electron beams), and reference numeral 4 indicates reactive etching species. Accordingly, it is necessary for the resist materials (i) to have high sensitivity to high-energy beams in consideration of quick pattern fabrication, (ii) to be keenly sensitive to the high energy beams so as to obtain high pattern-resolution capability, and (iii) to have high etching resistance in the etching of semiconductor-substrate. Generally, the thinner the resist film is, the smaller the spreading of the high energy beam is in the resist film; thus, pattern resolution is increased. Similarly, due to thinner resist films, etched pattern transfer difference from a resist pattern becomes smaller; thus, fabrication precision in the substrate etching is improved. Therefore, the pattern fabrication has been performed with a resist film as thin as possible. In particular, in the research and development of most-advanced devices such as the next ULSI, or quantum-effect devices, pattern widths will be in a range between 10 nm~150 nm, thus thinning of resist films is much more necessary for realizing miniaturization or nano-fabrication and higher precision.

The resist used for such ultra-fine processing can be generally classified into the following 5 types:

(1) a resist comprising an alkaline soluble resin and a diazonaphthoquinone-compound as a photo-sensitizer;

(2) an acrylic type polymer resist which degrades via main chain scission;

(3) a resist material comprising an alkaline soluble resin and an azide as a photo-sensitizer;

(4) a crosslinking type resist containing a chloromethyl group or an epoxy group; and (5) a chemical amplification resist comprising an alkaline soluble resin, an acid generator, and a dissolution controlling agent having an acid sensitive group.

The resist material of type (1), generally used in LSI processing, is exposed to UV and the diazonaphthoquinone-compound as a sensitizer is subjected to a chemical change during UV exposure, by which solubility of the alkaline soluble resin is enhanced and a pattern is fabricated. As the alkaline soluble resin, a novolac resin, a phenol resin, poly(hydroxy styrene), and the like are used; however, the novolac resin is most commonly used. This type of resist has been used for pattern fabrication with a relatively thick film, approximately up to 200 nm.

The resist material of type (2) has mainly been used in the ultra-fine pattern fabrication of 200 nm or less. In this type, the acrylic main chains are cut by irradiating an electron beam, an X-ray, or UV having a wavelength of 300 nm or less, by which solubility of the resist is enhanced and a pattern is fabricated. (i) Poly(methyl methacrylate) (i.e., PMMA), (ii) ZEP (manufactured by Nippon Zeon Co.) which is a copolymer of α-chloro methacrylate and α-methyl styrene, and (iii) poly 2,2,2-trifluoroethyl α-chloro acrylate (e.g., EBR-9 manufactured by Toray Co.) are representative resist materials of this type. In this type of resist, the difference in solubility rates between exposed and unexposed areas is very large, hence very high resolution can be realized. Therefore, this type of resist is generally used in thin-film form so as to fabricate an ultra-fine pattern of 200 nm or less.

As an example of fabricating a fine pattern of 10–50 nm range by thinning the resist film, it has been reported, in "Fabrication of 5–7 nm wide etched lines in silicon using 100 keV electron-beam lithography and polymethylmethacrylate resist", Applied Physics Letters, Vol. 62 (13), pp. 1499–1501, Mar. 29, 1993, that a Si substrate is dry-etched through a mixture gas of $SiCl_4$ and $CF_4$ by using a 65 nm thick PMMA resist, a representative high-resolution resist. Another article, "Si nanostructures fabricated by electron beam lithography combined with image reversal process using electron cyclotron resonance plasma oxidation", Journal of Vacuum Science and Technology, Vol. B13 (6), pp. 2170–2174, November/December, 1995, also reported the use of a 50 nm thick ZEP resist, which is known to have resolution as good as PMMA and also to have relatively high etching resistance for oxygen plasma processing of substrate.

On the other hand, in the case of defining a relatively large nanometer pattern of 50–150 nm, necessary resolution can be achieved in the present circumstances by using a relatively thick PMMA or ZEP resist and high energy beams mentioned above. In this range of pattern size, it is rather important to process substrates without forming any defects during dry-etching; then, the resist thickness is increased to ensure necessary dry-etching resistance. Typical resist thickness for this purpose is in a range of 0.1–0.5 $\mu$m.

The resist material of type (3) is normally used for UV or an electron beam exposure. This type of resist comprises the azide as a photo-sensitizer and the alkaline soluble resin, and the chemical change of azide, and the UV or electron beam exposure makes alkaline soluble resin insoluble, resulting in the formation of negative type patterns.

The resist material of type (4) comprises polymer resins containing the chloromethyl group or the epoxy group which has high crosslinking reactivity. In this type, the polymers are crosslinked with each other when they are irradiated by UV, an electron beam, or an X-ray, and the polymers become insoluble and a pattern is fabricated. This type of the resist is mainly used in negative-type pattern fabrication in which exposed areas remain.

The resist material of type (5) comprises the alkaline soluble resin, the acid generator, and the dissolution controlling agent (it may also be called a dissolution inhibitor) having the acid sensitive group. In this type, an acid is generated from the acid generator through irradiation of UV, electron beam, or X-ray, then, the acid reacts with the acid sensitive group of the dissolution controlling agent, by which the solubility of the alkaline soluble resin is changed and a pattern is fabricated. Since the reaction between the acid and the dissolution controlling agent proceeds via chain reaction scheme, very high sensitivity can be achieved in this type of resist. As the alkaline soluble resin, a novolac resin, a phenol resin, poly(hydroxy styrene), and the like are used. Additionally, in the chemical amplification type, there are some variations such that (i) the alkaline soluble resin functions as a dissolution controlling agent having an acid sensitive group, or (ii) a resin having an acid sensitive group reacts with an acid, making the resin alkaline soluble. However, in this type of resist, the acid becomes inactive due to water, ammonia, and the like included in the air, hence the resist sensitivity is considerably varied with the time between exposure and development. In order to stabilized the sensitivity, another polymer film to prevent the deactivators from penetrating in the resist film are overcoated on the resist.

Hereinbelow, common problems relating to the resists of the above (1)–(5) types will be explained.

In the conventional fine-pattern fabrication methods, even if a resist with relatively high resistance is used, minimum resist thickness for practical pattern fabrication is limited to approximately 50 nm. When the resist thickness is further reduced to get higher resolution, there occurs a problem that defects are generated on the processed substrate due to insufficient etching resistance of resist films, as shown in FIG. 3C.

Particularly, the acrylic main chain scission type resists have normally low etching resistance, because the main chain scission is also caused by etching reactive species; thus, it has been difficult to use this type of resist as a direct etching mask in a process including dry etching.

In addition, FIG. 7 shows a scanning electron microscope (SEM) photograph of a 0.05 $\mu$m line-and-space pattern of thin resist. As clearly shown from the photograph, there has been a problem in that underexposed areas just near irradiated areas are partially dissolved during the development and a fine pattern having a vertical sectional form cannot be obtained.

Furthermore, when relatively thick resist of typically 0.2–0.5 $\mu$m for the pattern fabrication of relatively large regime such as 50–150 nm is used to ensure sufficient etching resistance, the aspect ratio (i.e., a ratio of the pattern height to the pattern width) of the resist pattern must be increased to 4, or more. The inventors of the present invention found a problem that such high aspect patterns tend to collapse in a drying process of rinse solvent used for the development, because of the surface tension of the rinse solvent. As the collapse of high aspect ratio patterns is related to the mechanical strength of the resist film, in the case of resist thickness of about 50 nm, which is almost the minimum thickness for a practical nanometer fabrication process, very fine patterns around 10 nm wide tend to collapse since the aspect ratio is more than 4. Thus, the low mechanical strength of the resist film is a serious issue in nanometer pattern fabrication.

The inventors also paid attention to a time-dependent sensitivity problem in chemical amplification resist using an acid generated by irradiation of high energy beams as a catalyst as mentioned above. A polymer overcoat on the resist to stabilize sensitivity is inevitable in this case and this causes more complicated processes. Furthermore, in the case of thinner resist film which suffers more seriously from this problem, because deactivators such as water and ammonia can easily penetrate through the film, the polymer overcoat is not sufficient to completely stabilize the resist sensitivity, thus it is very difficult to perform highly precise pattern fabrication.

SUMMARY OF THE INVENTION

It is an object of the present invention to provide a resist material and a fabrication method thereof, by which the above-described problems with respect to the fine pattern fabrication for semiconductor substrate, and the like, can be solved, and highly precise processing of the substrate can be realized.

Accordingly, the present invention provides a resist material having a resist and particles mixed into the resist, a major component of the particles being a cluster of carbon atoms. The resist may be selected from the following 5 types:

(1) a resist comprising an alkaline soluble resin and a diazonaphthoquinone-compound as a photo-sensitizer;

(2) an acrylic type polymer resist which degrades via main chain scission;

(3) a resist material comprising an alkaline soluble resin and an azide as a photo-sensitizer;

(4) a crosslinking type resist containing a chloromethyl group or an epoxy group; and (5) a chemical amplification resist comprising an alkaline soluble resin, an acid generator, and a dissolution controlling agent having an acid sensitive group.

The present invention also provides a method for fabricating a resist material, by repeatedly performing:

(1) a first step of coating a substrate with a resist film; and (2) a second step of depositing particles whose major component is a cluster of carbon atoms on the resist film.

The resist material of the present invention achieves two functions such as (i) closely packing the resist film with carbon particles because free spaces among resist molecules formed during spin-coating process are filled up by the particles, and (ii) inhibiting penetration of etching reactive species into the resist film and enhancing the etching resistance of the resist film because the major component of the particles is a cluster of carbon atoms which has high etching resistance.

Regarding functions resulting from the high etching resistance of the carbon atoms, for example, the article "Amorphous carbon films as resist masks with high reactive ion etching resistance for nanometer lithography", Applied Physics Letters, Vol. 48 (13), pp. 835–837, 1986, discloses that regarding oxygen plasma dry etching, a film consisting only of a cluster of carbon atoms has etching resistance twice as high as that of a resist of a novolac resin base, the novolac resin being known to have higher etching resistance than the PMMA.

In addition to the enhancement of etching resistance according to the present invention, the penetration of developer molecules into the film is suppressed, and consequently, the contrast of the resist pattern is improved. This is because, as described in, for example, Vol. 5, page 749, of *Kagaku Daijiten* ("Chemical Terms Dictionary"), published by Kyoritsu Shuppan Publishing Co. in 1981, a cluster consisting of only carbon atoms is generally insoluble in organic and inorganic solvents, hence such a cluster is also insoluble in a resist developer in which normal organic and inorganic chemicals are used. If spaces in a resist film are filled with carbon particles having such characteristics, the solubility of the resist is lowered. However, in a resist belonging to the above types (1), (2), and (5), volatile components are generated in exposed areas, and these volatile components make it easier for the developer molecules to penetrate the resist film. Accordingly, exposed and unexposed areas show large difference in solubilities, thus high resolution can be obtained.

Furthermore, in the chemical-amplification type resist material according to the present invention, penetration of water, ammonia, and the like, which makes an acid catalyst inactive, can be suppressed; thus, the sensitivity of the resist is stabilized.

In addition, such particles having a cluster of carbon atoms as a major component generally have high melting points in comparison with organic substances such as resists (for example, fullerene $C_{60}$, described below, has a melting point of 700° C. or more). Therefore, such fine carbon particles with high melting points suppress the thermal movement of resist molecules, and increase the heat resistance of the resist material.

As particles having a cluster of carbon atoms as a major component, fullerene compounds of the so called "fullerene family" can be used. The fullerene family which is characterized as having a spherical molecular structure of carbon atoms includes fullerene $C_{60}$, high-order fullerenes having more than 60 carbon atoms, a cylindrically elongated nanotube (a kind of high-order fullerene), a metal-encapsulating fullerene in which a metal is incorporated in its spherical molecular structure, and the like. Among these compounds, fullerene compounds with smaller molecular sizes are more suitable for this invention, from the view point of the capability of forming closely packed films with resists.

Fullerene derivatives, in which another atom such as a hydrogen or a group such as a methyl group is combined with carbon atoms of the fullerene, are also effective in forming composite films with resists. As fullerene derivatives, any kinds can be used in principle. However, those having smaller molecular sizes are similarly desirable from a view of the capability of forming closely packed film with resist. Furthermore, the fullerene derivatives with suitable functional groups which enhance the solubility in coating solvents for conventional resists are the most desirable.

The mixtures of fullerene compounds mentioned above and mixtures of fullerene compounds and fullerene derivatives can also be used for this invention.

The mechanical strength of the resist is improved by incorporation of fullerene with resist, hence the above-mentioned problem, in which high aspect ratio patterns tend to collapse during the drying of rinse solvents in the development process, can be solved.

As a further effect by incorporation of fullerene, the above-mentioned problem relating to the chemical amplification resist, in which the sensitivity changes with time after exposure is solved because it becomes more difficult for acid-deactivators to penetrate through a closely packed composite resist film. Therefore, an extra process for stabilizing the sensitivity of a chemical amplification resist, such as over-coating, can be eliminated, thus, the fabrication processes are simplified.

As an example of using the fullerene as a component of a resist material, Japanese Patent Application, First Publication, Hei 6-167812 has been known. The resist material disclosed in this publication consists of a fullerene and a photosensitive material. This resist belongs to a type in which the resist is composed of a conventional resin (such as the novolac resin) and a photosensitive material, and the use of a fullerene or fullerene derivative instead of such a (novolac) resin is a feature of the material disclosed in the publication. Therefore, in this invention, a resin component in the resist is a fullerene or fullerene derivative; thus, some of the above-mentioned problems still remain, such as, the cost of the resist is increased, and conventional processes for treating resists have to be changed because the solvent used for the development is limited to those which will sufficiently dissolve fullerene and fullerene derivatives which are normally used in conventional fabrication processes. Furthermore, this invention claims that the effect of the invention is the enhancement of dry-etching durability, resulting in the increase of the sensitivity due to the use of thinner resist.

In contrast, the resist materials in the present invention is the composite of carbon particles and conventional resist comprising a resin and a photosensitive material. As the carbon particles such as fullerene compounds are additives to the conventional resist, the resist can be developed using conventional developer, thus, no change in conventional processes for treating the resist is required. Regarding the effect of the present invention, by incorporating carbon particles, various characteristics of the resist such as etching resistance, resolution, heat resistance, mechanical strength, and sensitivity stability after exposure can be greatly improved. Since the amount of carbon particles to obtain above-mentioned various effects in the present invention is small as compared with the resin and photosensitizer of conventional resist, the cost of the resist material is not so much increased even though a currently expensive material is used, such as the fullerene. Therefore, the present invention is useful, and is superior in cost-performance.

That is, according to the resist material and the fabrication method thereof according to the present invention, a closely packed resist film incorporated with carbon particles can be obtained, and it is possible to realize various improvements of (i) dry-etching durability, (ii) contrast of resist patterns; (iii) resist sensitivity; (iv) heat resistance of resist films; (v) mechanical strength of resist patterns, and further, (vi) stabilization of resist sensitivity. Therefore, highly precise fine pattern fabrication can be realized. Furthermore, conventional developers and developing methods can be used in the fabrication process, and the resist after the substrate etching process can be removed using either oxygen-plasma ashing and resist remover solution, thus, another effect relating to processing compatibility is obtained.

DESCRIPTION OF THE PREFERRED EMBODIMENTS

Hereinbelow, preferred embodiments of the present invention will be explained in detail with reference to the drawings.

Figure 1A:
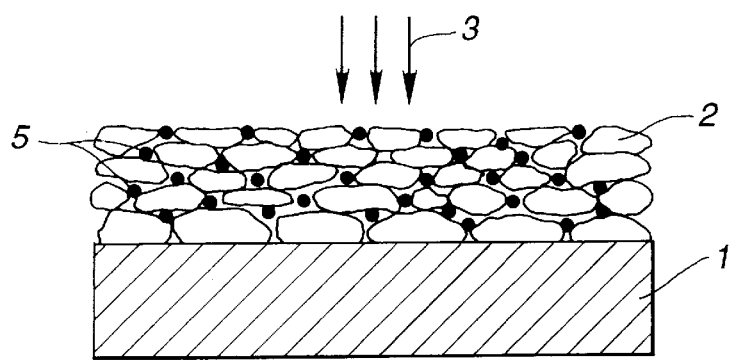
FIGS. 1A–1C are diagrams for explaining processes for fabricating a pattern using a resist material according to the present invention.
Figure 1B:
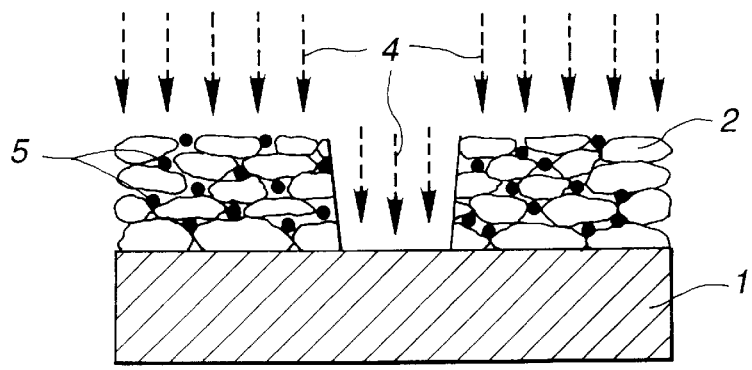
Figure 1C:
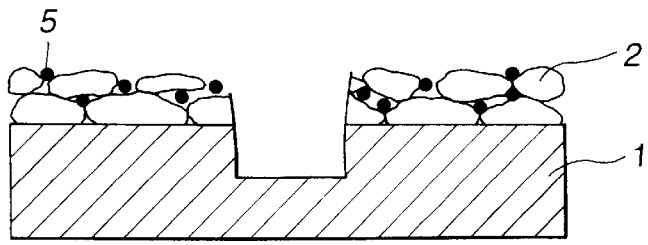
Figure 3A:
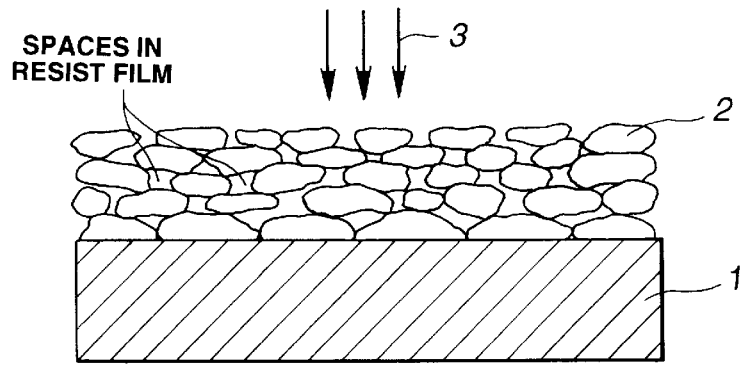
FIGS. 3A–3C are diagrams for explaining processes for fabricating a pattern using a conventional resist material.
Figure 3B:
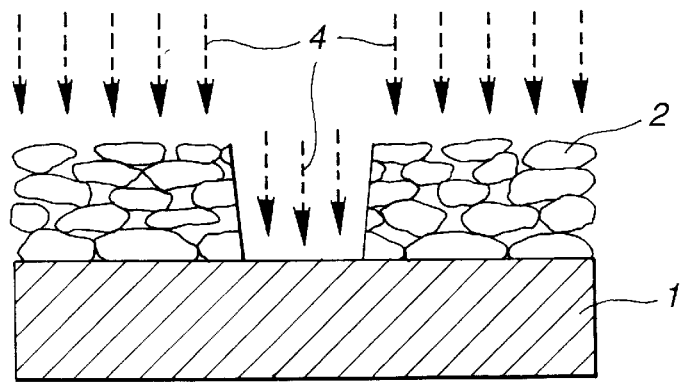
Figure 3C:
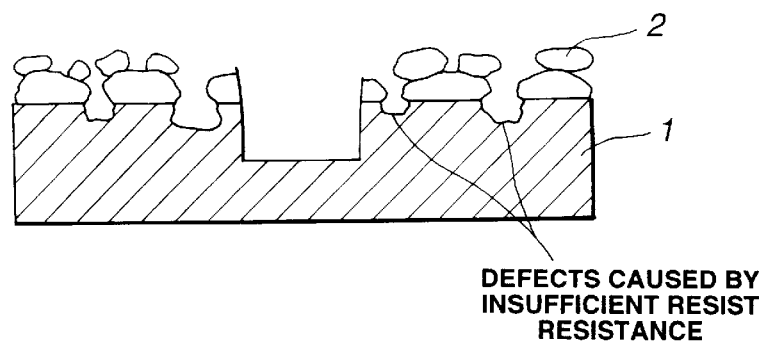

FIGS. 1A–1C are diagrams for explaining processes for fabricating a pattern using a resist material according to the present invention. In the FIGS. 1A–1C, reference numerals 1–4 correspond to the same reference numerals as shown in FIGS. 3A–3C, and reference numeral 5 indicates particles whose major component (that is, the major component of each particle) is a cluster of carbon atoms. As clearly shown by FIGS. 1A–1C, in the resist material according to the present invention, particles whose major component is a cluster of carbon atoms are dispersed in spaces in the resist film.

Figure 2A:
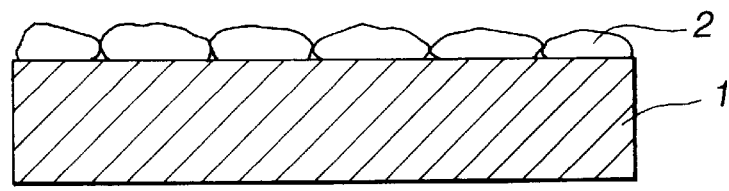
FIGS. 2A–2C are diagrams for explaining an example of the method of the present invention for fabricating a resist material including particles whose main component is a cluster of carbon atoms.
Figure 2B:
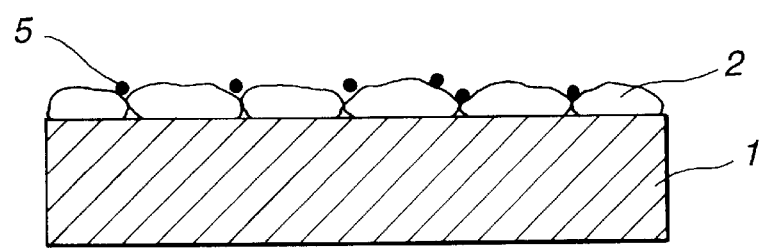
Figure 2C:
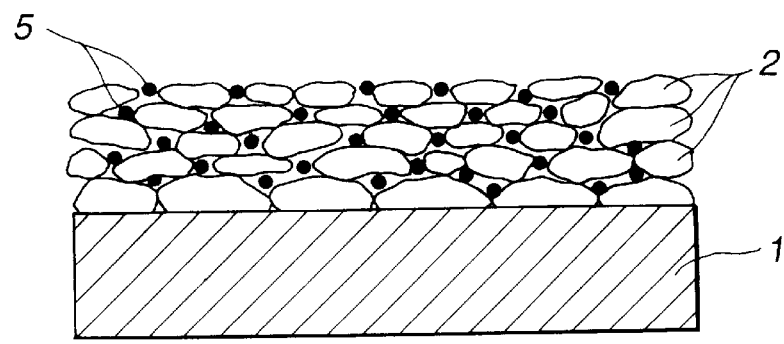

Next, the fabrication method of a resist material according to the present invention will be explained with reference to FIGS. 2A–2C. That is, FIGS. 2A–2C are diagrams for explaining an example of the method of the present invention for fabricating a resist material including particles whose main component is a cluster of carbon atoms. In FIGS. 2A–2C, reference numerals 1, 2, and 5 correspond to the same reference numerals in FIGS. 1A–1C, and FIGS. 2A–2C correspond to the following three processes (a)–(c).

(a) First, a substrate is coated with a resist film, and is baked.

(b) Next, particles whose major component is a cluster of carbon atoms are deposited on the resist.

(c) processes (a) and (b) are repeated.

In this way, a resist film, in which a resist material of the present invention having a desired thickness is deposited, is obtained. Instead of this method, a simpler method of making a resist material according to the present invention can be used.

This method is the spin-coating of the solution containing conventional resist and particles whose main component is a cluster of carbon atoms.

Hereinbelow, resist materials and the fabrication method thereof in connection with the present invention will be explained in detail based on some practical embodiments; however, the present invention is not limited to those embodiments.

In the following, the resists used in embodiments 1–5 and 7–15 belong to the above type (2) described in the "Description of the Related Art"; the resists used in embodiments 6 and 16 belong to the above type (5); the resist used in embodiment 17 belongs to the above type (4); the resist used in embodiment 18 belongs to the above type (3); and the resist used in embodiment 19 belongs to the above type (1).

First Embodiment

The resist used in this embodiment is the above-mentioned PMMA (molecular weight: 600,000, manufactured by Tokyo Ohka Kogyo Co., Ltd.), a representative positive e-beam resist (that is, in this positive type, areas which are subjected to e-beam exposure are removed by development, as a result, a pattern is fabricated). For 100 parts by weight of this PMMA, 1–50 parts by weight of particles whose main component is a cluster of carbon atoms were incorporated so as to form a resist material.

Hereinbelow, the method for fabricating the resist material in the present embodiment will be explained with reference to FIGS. 2A–2C.

Process 1 (see FIG. 2A): a Si substrate is spin-coated with the PMMA resist at a thickness of 10 nm, and the substrate is baked at 170° C. for 30 minutes.

Process 2 (see FIG. 2B): The Si substrate, on which the PMMA resist film was deposited, is put in a vacuum-discharge machine, and carbon particles are deposited onto the PMMA resist film by discharging carbon electrodes. In this process, the size and the amount of the carbon particles to be formed can be controlled by adjusting the degree of vacuum, discharge time, or the like. In this first embodiment, the degree of vacuum was approximately $10^{-3}$ Torr; while the discharge time was 0.2 sec, by which carbon particles having the size of 1 nm or less could be formed. Regarding the amount of deposited particles, the area coated with the particles was set to be around 30% with respect to the substrate area. Here, the size of the particles and the deposition amount were measured using an atomic force microscope.

Process 3 (see FIG. 2C): By repeating the processes 1 and 2 after once taking out the above substrate from the vacuum-discharge machine, a resist material including carbon particles is obtained. In this case, when the substrate is baked after coating the top-layer PMMA, the carbon particles which were deposited on lower layer PMMA film are moved by the thermal motion of the PMMA molecules, hence uniformity in the distribution of carbon particles inside the film is improved. In this first embodiment, the processes 1 and 2 were repeated by 5 times, by which a resist film of approximately 50 nm was obtained. After fabricating the resist film, a pattern fabrication experiment was performed using an electron beam exposure machine with 50 kV acceleration voltage. In the experiment, a conventional standard developer for the PMMA (i.e., a 2/1 mixture of methyl isobutyl ketone/isopropyl alcohol) was used, and a 15 nm pattern could be fabricated, where resolution as good as the conventional PMMA could be confirmed.

Figure 6:
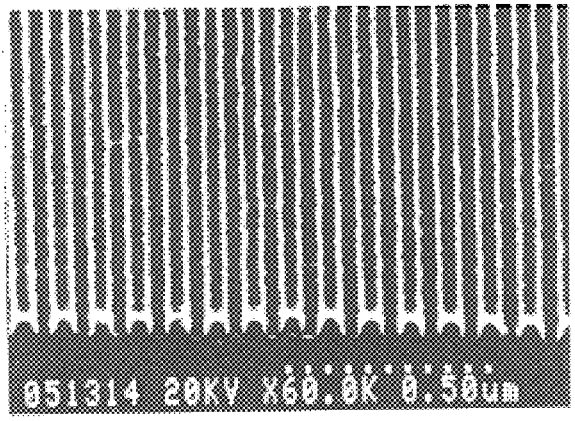
FIG. 6 is a SEM photograph of a fine pattern obtained in an example of pattern fabrication using a resist material according to the present invention.
Figure 7:
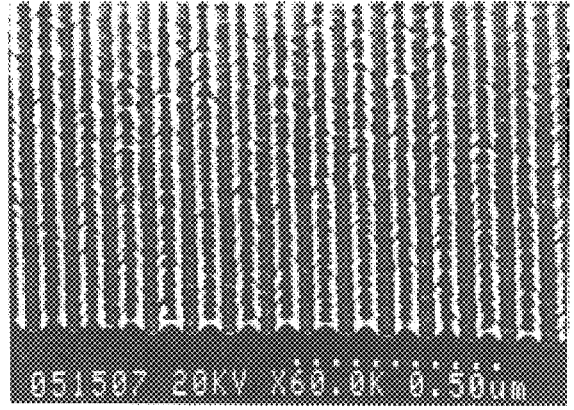
FIG. 7 is a SEM photograph of a fine pattern obtained in an example of pattern fabrication using a conventional resist material.

The pattern contrast was evaluated by using a 0.05 $\mu$m line-and-space pattern, with the same processing conditions as used in the above evaluation relating to the resolution. FIG. 6 shows a SEM photograph of a pattern formed using the resist material according to the present invention and FIG. 7 shows a SEM photograph of a pattern formed using the conventional resist. As clearly shown by these photographs where the pattern edge becomes almost vertical, the pattern contrast is improved in the case of the resist material of the present embodiment.

Figure 4:
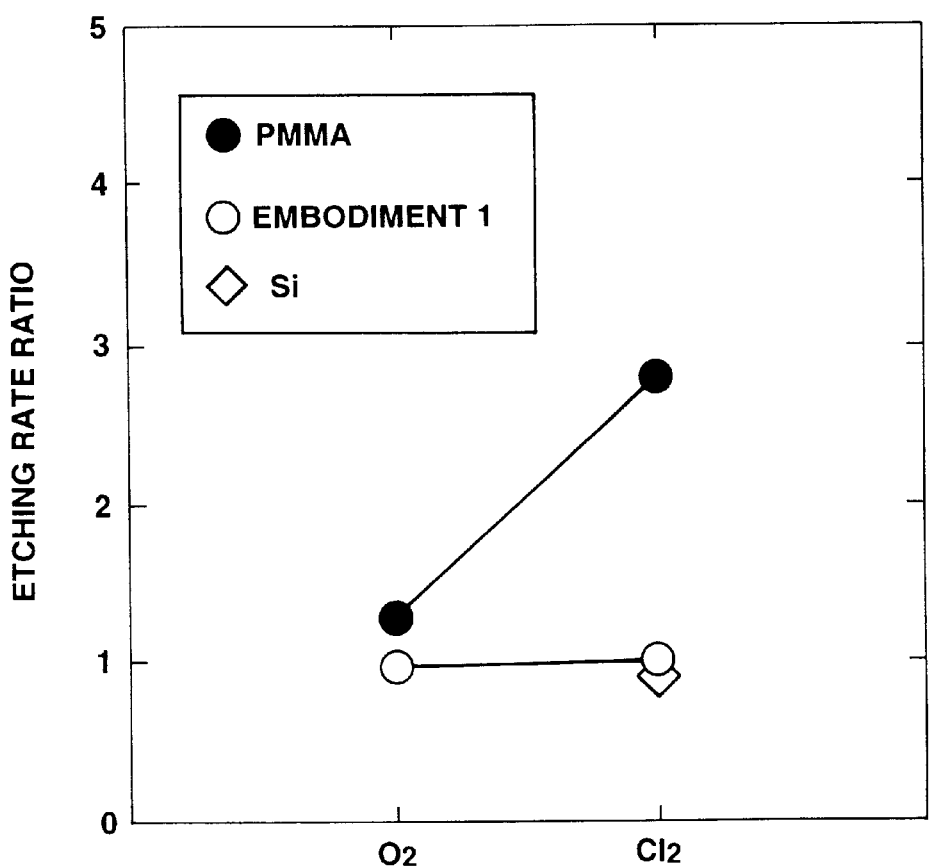
FIG. 4 is a graph diagram for comparing etching resistance durabilities of conventional resist materials and a resist material according to the present invention.

FIG. 4 shows a result of evaluation relating to dry-etching resistance of the resist material according to the present invention in comparison with the conventional PMMA resist. In the figure, regarding the etching rate ratio in the vertical axis, the etching rate of the resist material of the first embodiment is set to be 1. In addition, black circles, white circles, and a rhombus respectively show results of the (pure) PMMA, the resist material of the present embodiment, and Si.

First, regarding reactive dry etching using $O_2$ gas for etching organic polymer films, under etching conditions of gas flow: 20 SCCM; gas pressure: 2 Pa; and power: 50 W; the resist material of the first embodiment had an etching rate of approximately 20% less than that of the PMMA; thus, the resistance was improved by this rate. On the other hand, regarding ECR (electron cyclotron resonance) dry etching using $Cl_2$ gas for etching a Si substrate, under etching conditions of gas flow: 40 SCCM; gas pressure: 0.05 Pa; and microwave power: 200 W; the resist of the first embodiment had etching resistance approximately 3 times as high as that of the PMMA; thus, it was proved that by using a resist material with a thickness approximately one third of the conventional PMMA, substrate etching with an etching depth approximately as deep as that of the conventional PMMA could be performed. Accordingly, as shown in FIGS. 1C and 3C, even with a film thickness which causes defects due to the etching in a conventional resist, desirable substrate etching without defects is realized using the resist material of the first embodiment.

In this embodiment, a vacuum discharge method was used in the process of depositing carbon particles; however, another method may be used such as vacuum deposition of particles whose major component is a cluster of carbon atoms, sputter using a carbon target, or chemical vapor deposition (CVD) using a hydrocarbon gas, for example, methane, acetylene or ethylene. In these methods, impurities such as hydrogen and oxygen are generally included in the formed carbon particles; thus, it is difficult to form pure carbon particles. However, even in those cases, etching resistance may still be improved in accordance with purity of carbon particles.

Additionally, the above processes 1 and 2 were repeated five times and pattern fabrication was successively performed in this embodiment. However, for convenience of pattern fabrication, the two processes of (i) fabrication of a resist material and (ii) formation of a resist film may be separated. In this case, a resist material is first formed on a substrate, and the resist material is dissolved using a coating solvent so as to adjust a film thickness for coating. Then another substrate for etching is spin-coated with the dissolved material.

Second Embodiment

The resist used in this embodiment is also the above-mentioned PMMA (molecular weight: 600,000, manufactured by Tokyo Ohka Kogyo Co. Ltd), a representative positive e-beam resist. For 100 parts by weight of this PMMA, 35 parts by weight of fullerene $C_{60}$ (manufactured by Tokyo Kasei Co.) were incorporated so as to form a resist material.

After dissolving the PMMA in methyl cellosolve acetate to have 10 wt % concentration and fullerene $C_{60}$ in monochlorobenzene to have 1 wt % concentration, both solutions were mixed to make a PMMA resist solution including fullerene $C_{60}$. In order to evaluate the resolution of this resist, a Si substrate was spin-coated with the resist at a thickness of 50 nm, and after baking at 170° C. for 30 minutes, an exposure experiment using the electron beam exposure machine (50 kV) was performed. In the experiment, the resist was developed using a conventional standard developer for the PMMA (i.e., a 2/1 mixture of methyl isobutyl ketone/isopropyl alcohol) for 3 minutes, and a 15 nm pattern could be fabricated, where resolution as good as the conventional PMMA could be recognized.

The pattern contrast was evaluated by using a 0.05 $\mu$m line-and-space pattern, with the same processing conditions as used in the above evaluation of the resolution. As results of the evaluation, improvement of the pattern contrast was confirmed as in the first embodiment.

Figure 5:
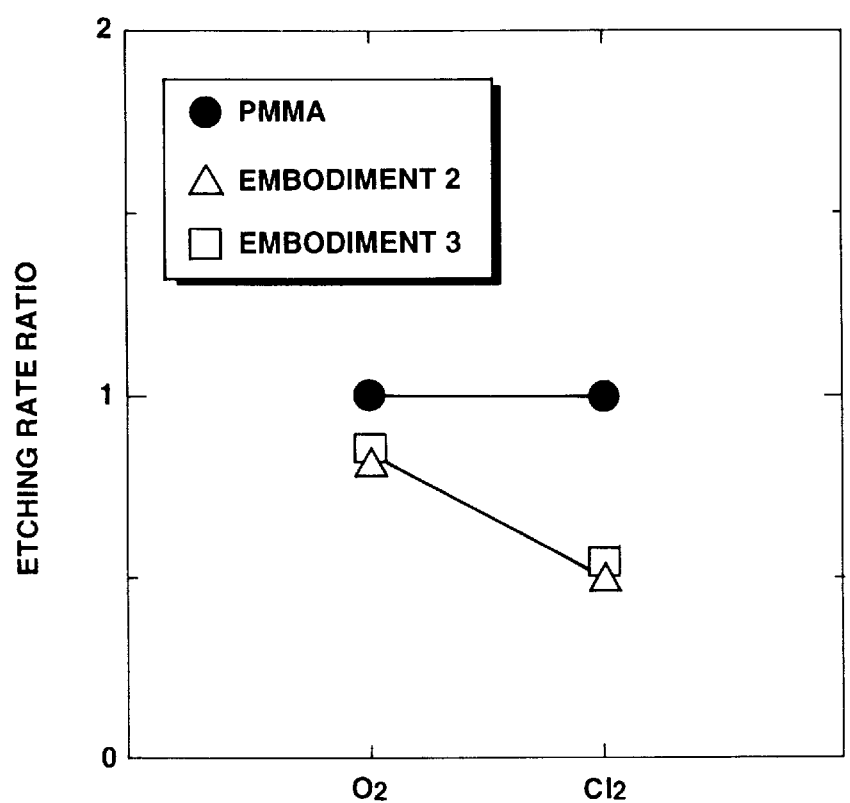
FIG. 5 is a graph diagram for comparing etching resistance durabilities of a conventional resist material and resist materials according to the present invention.

FIG. 5 shows a result of evaluation relating to dry-etching resistance of the resist material according to the present embodiment in comparison with a conventional PMMA resist. In the figure, regarding the etching rate ratio in the vertical axis, the etching rate of the (pure) PMMA is set to be 1. In addition, black circles, white triangles, and white squares respectively show results of the PMMA, the resist material of the second (present) embodiment, and the (later-explained) third embodiment.

First, regarding reactive dry etching using $O_2$ gas for etching organic polymer films, under etching conditions of gas flow: 20 SCCM; gas pressure: 2 Pa; and power: 50 W; the resist material of the second embodiment had an etching rate of approximately 20% less than that of the PMMA; thus, the resistance was improved by this rate. On the other hand, regarding the ECR dry etching using $Cl_2$ gas for etching a Si substrate, under etching conditions of gas flow: 40 SCCM; gas pressure: 0.05 Pa; and microwave power: 200 W; the resist of the second embodiment had etching resistance approximately 2 times as high as that of the PMMA; thus, it was proved that by using a resist material with a thickness approximately one half of the conventional PMMA, substrate etching with an etching depth approximately as deep as that of the conventional PMMA could be performed. Accordingly, as shown by FIGS. 1C and 3C, even with a film thickness which causes defects due to the etching in a conventional resist, desirable substrate etching without defects is realized using the resist material of the second embodiment.

Third Embodiment

The resist used in this embodiment is the PMMA (molecular weight: 600,000, manufactured by Tokyo Ohka Kogyo Co. Ltd), and for 100 parts by weight of this PMMA, 35 parts by weight of hydrogenated fullerene $C_{60}H_{36}$ (manufactured by MER Co.), which is obtained by adding hydrogen to the fullerene, were incorporated so as to form a resist material.

In order to evaluate the resolution of this resist, a Si substrate was spin-coated with the resist at a thickness of 50 nm, and after baking at 170° C. for 30 minutes, an exposure experiment using the electron beam exposure machine (50 kV) was performed. In the experiment, the resist was developed using a conventional standard developer for the PMMA (i.e., a 2/1 mixtue of methyl isobutyl ketone/isopropyl alcohol) for 3 minutes, and a 15 nm pattern could be fabricated as could in the second embodiment, where resolution as good as the conventional PMMA could be confirmed.

The pattern contrast was evaluated by using a 0.05 $\mu$m line-and-space pattern, with the same processing conditions as used in the above evaluation of the resolution. As results of the evaluation, improvement of the pattern contrast was confirmed as in the first embodiment.

FIG. 5 shows a result of evaluation with respect to dry-etching resistance of the resist material according to the present embodiment in comparison with the conventional PMMA resist. In the figure, regarding the etching rate ratio in the vertical axis, the etching rate of the PMMA is set to be 1. First, regarding reactive dry etching using $O_2$ gas for etching organic polymer films, under etching conditions of gas flow: 20 SCCM; gas pressure: 2 Pa; and power: 50 W; the resist material of the third embodiment had an etching rate of approximately 20% less than that of the PMMA; thus, the resistance was improved by this rate. On the other hand, regarding the ECR dry etching using $Cl_2$ gas for etching a Si substrate, under etching conditions of gas flow: 40 SCCM; gas pressure: 0.05 Pa; and microwave power: 200 W; the resist of the third embodiment had etching resistance approximately 2 times as high as that of the PMMA; thus, it was proved that by using a resist material with a thickness approximately one half of the conventional PMMA, substrate etching with an etching depth approximately as deep as that of the conventional PMMA could be performed also in this case.

Fourth Embodiment

Instead of the hydrogenated fullerene used in the third embodiment, a methyl fullerene comprising a methyl group (manufactured by Tokyo Kasei Co.) was used in the fourth embodiment, and results as good as those obtained in the third embodiment could be obtained.

Fifth Embodiment

Instead of the fullerene $C_{60}$ used in the second embodiment, fullerene $C_{60}$ including La (manufactured by MER Co.) was used in the fifth embodiment, and almost the same results as the second embodiment could be obtained.

Sixth Embodiment

The resist used in this embodiment is SAL601 (manufactured by Shipley Co.), a conventional chemical amplification negative e-beam resist (that is, in this negative type, areas which are subjected to high energy beam exposure remain after development, and thereby, a pattern is fabricated). For 100 solid parts by weight of this SAL601, 3 parts by weight of fullerene $C_{60}$ (manufactured by Tokyo Kasei Co.) were incorporated so as to form a resist material. After dissolving the fullerene $C_{60}$ in monochlorobenzene to have 1 wt % concentration, this solution was mixed into the above SAL601 to make a SAL601 resist solution including fullerene $C_{60}$.

Then, a Si substrate was spin-coated with this resist solution at a thickness of 100 nm, and after baking at 105° C. for 2 minutes, exposure was performed using the electron beam exposure machine (50 kV). After the exposure, the substrate was kept in an air environment, so as to perform an experiment for evaluating resist sensitivity. The sensitivity evaluation was performed such that the substrate kept in the air environment for a fixed time was baked at 105° C. for 2 minutes, and was developed using a tetramethylammonium hydroxide aqueous solution of 0.27 N (normality) for 6 minutes, and the remaining thickness with respect to the exposure dose was measured using a film-thickness measurement instrument.

Figure 8:
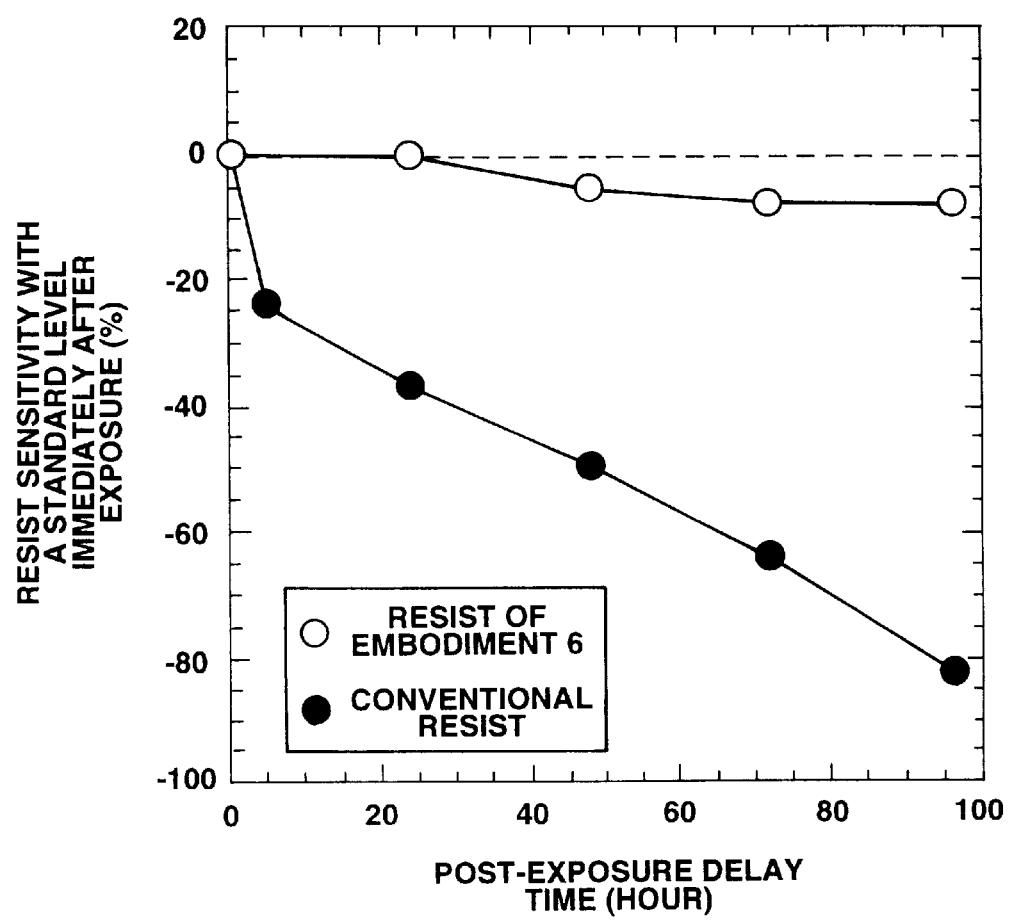
FIG. 8 is a graph diagram for comparing sensitivity stabilities of a conventional resist material and a resist material according to the present invention.

FIG. 8 shows results of the sensitivity evaluation for the resist material of the present embodiment in comparison with the conventional chemical amplification SAL601 resist which does not contain the fullerene. That is, this figure is a graph diagram for comparing sensitivity stabilities of a conventional resist material and a resist material according to the present invention. In FIG. 8, the vertical axis indicates resist sensitivity (%) with a standard level immediately after the exposure, while the horizontal axis indicates the post-exposure delay time (hour). In addition, black circles and white circles in FIG. 8 respectively show results of the resist material of the sixth embodiment and the conventional chemical amplification resist. As shown in the figure, the resist material of the present invention had only a few percent of sensitivity degradation (with respect to the standard level immediately after the exposure) even with the post-exposure delay time of around 100 hours, while in the case of the conventional chemical amplification resist, resist sensitivity was decreased by 80% or more. As clearly understood by these results, sensitivity stabilization for the chemical amplification resist can be realized by using a resist material according to the present embodiment.

Seventh Embodiment

The resist used in this embodiment is ZEP520 (manufactured by Nippon Zeon Co.), a positive e-beam resist, and for 100 solid parts by weight of this ZEP520, 10 parts by weight of fullerene $C_{60}$ (manufactured by Kanto Chemical Co.) were incorporated so as to form a resist material. After dissolving the fullerene $C_{60}$ in ortho-dichlorobenzene to have 1 wt % concentration, this solution was mixed into the above ZEP520 to make a ZEP520 resist solution including fullerene $C_{60}$.

Then, a Si substrate was spin-coated with this resist solution at a thickness of 50 nm, and after baking at 165° C. for 30 minutes, exposure was performed using the electron beam exposure machine (25 kV). After the exposure, the substrate was developed using n-amyl acetate, a standard developer for the ZEP520 resist, for 3 minutes. In this way, a high-contrast pattern approximately the same as the first embodiment could be fabricated.

In addition, another Si substrate was spin-coated with the resist solution of the present embodiment at a thickness of 50 nm, and after baking at 165° C. for 30 minutes, exposure was performed using the electron beam exposure machine (25 kV). After the exposure, the substrate was developed using diethyl ketone, a strong developer for the ZEP520 resist, for 3 minutes, and then the remaining film thickness with respect to the exposure dose was measured using the film-thickness measurement instrument so as to examine resist sensitivity.

Figure 9:
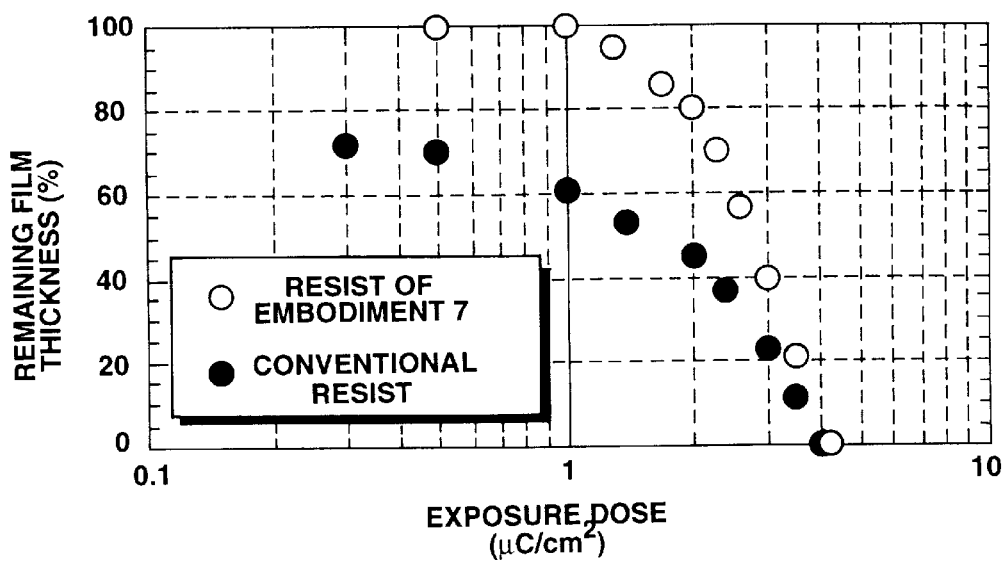
FIG. 9 is a graph diagram for comparing sensitivity (plotted) curves of a conventional resist material and a resist material according to the present invention.

FIG. 9 shows a sensitivity curve of the resist material of the present embodiment in comparison with that of the conventional ZEP520 resist which does not contain the fullerene. That is, FIG. 9 is a graph diagram for comparing sensitivity (plotted) curves of a conventional resist material and a resist material according to the present invention. In FIG. 9, the vertical axis indicates (the rate of) remaining film thickness (%: a percentage of a thickness after the development with respect to the initial thickness before exposure), while the horizontal axis indicates the exposure dose ($\mu C/cm^2$). In addition, black circles and white circles in FIG. 9 respectively show results of the resist material of the seventh embodiment and the conventional resist. As shown by the figure, in both resists, the exposure dose (indicating the resist sensitivity) by which the remaining film thickness becomes 0% was at around 5 $\mu C/cm^2$; thus, sensitivity was improved (in the case of using the above-mentioned standard developer, the exposure dose corresponding to the "0%" remaining film thickness was 50 $\mu C/cm^2$). However, in the conventional (pure) ZEP520 resist, it is obvious with reference to FIG. 9 that the initial thickness in an unexposed or underexposed area was decreased by around 30% due to the usage of a strong developer. That is, in this case, "thickness degradation" occurred and thus the pattern contrast was degraded. In contrast, in the resist material of the seventh embodiment, such thickness degradation was not at all found; therefore, sensitivity could be improved without degradation of the pattern contrast.

In addition, regarding reactive dry etching using $O_2$ gas or ECR dry etching using $Cl_2$ gas, etching resistance was improved similar to the second embodiment, that is, improvement of etching resistance was also confirmed for the resist material in the seventh embodiment.

Heat resistance of the resist of this seventh embodiment was also evaluated. The evaluation was performed such that a Si substrate was spin-coated with the resist solution of the present embodiment at a thickness of 150 nm, and after baking at 165° C. for 30 minutes, exposure was performed using the electron beam exposure machine (25 kV). After the exposure, the substrate was developed using the above-mentioned standard developer so as to fabricate a pattern with 150 nm pitch. The substrate on which the pattern was fabricated was then baked in an oven at 100–200° C. for 30 minutes, and a cross section of the pattern was observed using a SEM.

Figure 10:
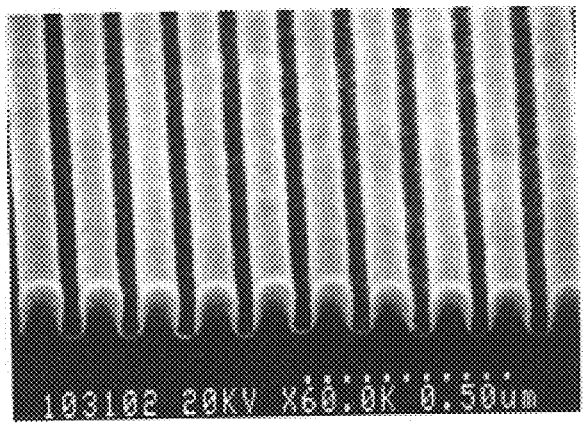
FIG. 10 is a SEM photograph showing heat resistance of a fine pattern obtained using a resist material according to the present invention.
Figure 11:
FIG. 11 is a SEM photograph showing heat resistance of a fine pattern obtained using a conventional resist material.

FIGS. 10 and 11 are SEM photographs of pattern cross sections (after baking) of the resist material according to the seventh embodiment and the conventional resist, respectively. That is, FIG. 10 is a SEM photograph showing heat resistance of a fine pattern obtained using a resist material according to the present invention, and FIG. 11 is a SEM photograph showing heat resistance of a fine pattern obtained using a conventional resist material. As clearly shown by FIGS. 10 and 11, heat resistance was enhanced in the case of the resist material according to the seventh embodiment.

Figure 12:
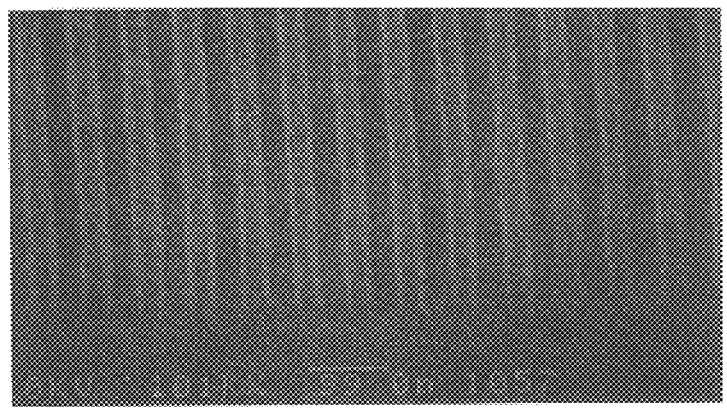
FIG. 12 is a SEM photograph showing mechanical strength of a fine pattern obtained using a resist material according to the present invention.
Figure 13:
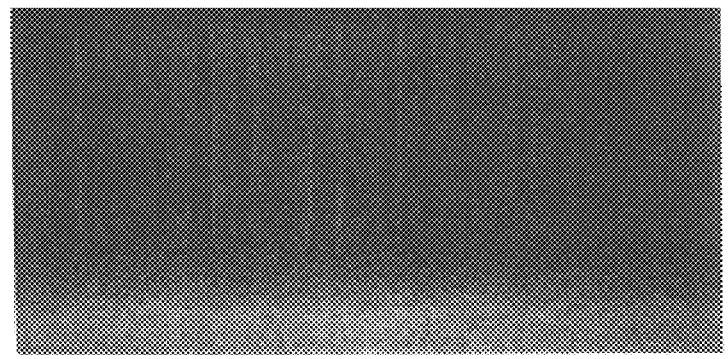
FIG. 13 is a SEM photograph showing mechanical strength of a fine pattern obtained using a conventional resist material.

Furthermore, mechanical resistance of the resist material of this seventh embodiment was evaluated. The evaluation was performed such that a Si substrate was spin-coated with the resist solution of the present embodiment at a thickness of 150 nm, and after baking at 165° C. for 30 minutes, exposure was performed using the electron beam exposure machine (25 kV). After the exposure, the substrate was developed using n-amyl acetate, a standard developer for the ZEP520 resist, for 3 minutes, and a minimum pitch producing acceptable resolution without detachment, collapse, snaking, or sticking of patterns was evaluated. FIGS. 12 and 13 are SEM photographs of pattern cross sections showing mechanical strengths of the resist material according to the seventh embodiment and the conventional resist, respectively. That is, FIG. 12 is a SEM photograph showing mechanical strength of a fine pattern obtained using a resist material according to the present invention, and FIG. 13 is a SEM photograph showing mechanical strength of a fine pattern obtained using a conventional resist material. As clearly shown by FIGS. 12 and 13, in the case of the resist material according to the seventh embodiment, good resolution was obtained with respect to a 60 nm pitch pattern, while in the conventional resist, detachment and snaking were found even with a 90 nm-pitch pattern and thus neighboring parts in the pattern merged with each other. Therefore, the pattern of the conventional resist could not be resolved. This pattern collapse is caused at the drying of rinse solvent during development process, that is, the high aspect ratio resist pattern could not stand against surface tension of the rinse solvent. The incorporation of fullerene acts as the reinforcement of the resist resin, and the mechanical strength can also be improved by using a resist material according to the seventh embodiment (for example, in contrast with a pattern aspect ratio of 3 in conventional cases, a pattern aspect ratio of 4–5 can be obtained in the present invention under the same conditions).

Eighth Embodiment

The resist used in this embodiment is ZEP520 (manufactured by Nippon Zeon Co.), a positive e-beam resist, and for 100 solid parts by weight of this ZEP520, 10 parts by weight of a 4/1 mixture of fullerene $C_{60}$/fullerene $C_{70}$ (i.e., $C_{60/70}$ :manufactured by Kanto Chemical Co.) were incorporated so as to form a resist material. After dissolving the fullerene $C_{60/70}$ in ortho-dichlorobenzene to have 1 wt % concentration, this solution was mixed into the above ZEP520 to make a ZEP520 resist solution including fullerene $C_{60/70}$. Then, a Si substrate was spin-coated with this resist solution, and an evaluation experiment similar to the seventh embodiment was performed. As a result, in the resist material according to the eighth embodiment, improvements of etching resistance, pattern contrast, sensitivity, heat resistance, and mechanical strength were also realized, as in the case of the seventh embodiment. In addition, instead of $C_{60/70}$, another mixture in which a trace quantity of higher order fullerene is included may be used, and it is more desirable in cost-performance.

Ninth Embodiment

The resist used in this embodiment is ZEP520 (manufactured by Nippon Zeon Co.), a positive e-beam resist, and for 100 solid parts by weight of this ZEP520, 10 parts by weight of hydrogenated fullerene $C_{60}H_{36}$ (manufactured by MER Co.), a fullerene derivative, were incorporated so as to form a resist material. Then, a Si substrate was spin-coated with this resist solution, and an evaluation experiment similar to the seventh embodiment was performed. As a result, in the resist material according to the ninth embodiment, improvements of etching resistance, pattern contrast, sensitivity, heat resistance, and mechanical strength were also realized, as in the case of the seventh embodiment.

Tenth Embodiment

The resist used in this embodiment is ZEP520 (manufactured by Nippon Zeon Co.), a positive e-beam resist, and for 100 solid parts by weight of this ZEP520, 10 parts by weight of hydrogenated fullerene $C_{60}H_{18}$ (manufactured by MER Co.), a fullerene derivative, were incorporated so as to form a resist material. Then, a Si substrate was spin-coated with this resist solution, and an evaluation experiment similar to the seventh embodiment was performed. As a result, in the resist material according to the tenth embodiment, improvements of etching resistance, pattern contrast, sensitivity, heat resistance, and mechanical strength were also realized, as in the case of the seventh embodiment.

Eleventh Embodiment

The resist used in this embodiment is ZEP520 (manufactured by Nippon Zeon Co.), a positive e-beam resist, and for 100 solid parts by weight of this ZEP520, 10 parts by weight of an approximately 1/1 mixture of fullerene $C_{60}$ (manufactured by Kanto Chemical Co.)/hydrogenated fullerene $C_{60}H_{36}$ (manufactured by MER Co.) were incorporated so as to form a resist material. Then, a Si substrate was spin-coated with this resist solution, and an evaluation experiment similar to the seventh embodiment was performed. As a result, in the resist material according to the eleventh embodiment, improvements of etching resistance, pattern contrast, sensitivity, heat resistance, and mechanical strength were also realized, as in the case of the seventh embodiment.

Twelfth Embodiment

The resist used in this embodiment is ZEP520 (manufactured by Nippon Zeon Co.), a positive e-beam resist, and for 100 solid parts by weight of this ZEP520, 10 parts by weight of an approximately 1/1 mixture of fullerene $C_{60}$ (manufactured by Kanto Chemical Co.)/hydrogenated fullerene $C_{60}H_{18}$ (manufactured by MER Co.) were incorporated so as to form a resist material. Then, a Si substrate was spin-coated with this resist solution, and an evaluation experiment similar to the seventh embodiment was performed. As a result, in the resist material according to the twelfth embodiment, improvements of etching resistance, pattern contrast, sensitivity, heat resistance, and mechanical strength were also realized, as in the case of the seventh embodiment.

Thirteenth Embodiment

The resist used in this embodiment is ZEP520 (manufactured by Nippon Zeon Co.), a positive e-beam resist, and for 100 solid parts by weight of this ZEP520, 10 parts by weight of an approximately 1/1/1 mixture of fullerene $C_{60}$ (manufactured by Kanto Chemical Co.)/ fullerene $C_{70}$ (manufactured by Kanto Chemical Co.)/ hydrogenated fullerene $C_{60}H_{36}$ (manufactured by MER Co.) were incorporated so as to form a resist material. By mixing various materials in this way, solubility can be much improved. Then, a Si substrate was spin-coated with this resist solution, and an evaluation experiment similar to the seventh embodiment was performed. As a result, in the resist material according to the thirteenth embodiment, improvements of etching resistance, pattern contrast, sensitivity, heat resistance, and mechanical strength were also realized, as in the case of the seventh embodiment.

Fourteenth Embodiment

The resist used in this embodiment is ZEP520 (manufactured by Nippon Zeon Co.), a positive e-beam resist, and for 100 solid parts by weight of this ZEP520, 10 parts by weight of an approximately 1/1/1/1 mixture of fullerene $C_{60}$ (manufactured by Kanto Chemical Co.)/ fullerene $C_{70}$ (manufactured by Kanto Chemical Co.)/ hydrogenated fullerene $C_{60}H_{18}$ (manufactured by MER Co.)/hydrogenated fullerene $C_{60}H_{36}$ (manufactured by MER Co.) were incorporated so as to form a resist material. Then, a Si substrate was spin-coated with this resist solution, and an evaluation experiment similar to the seventh embodiment was performed. As a result, in the resist material according to the fourteenth embodiment, improvements of etching resistance, pattern contrast, sensitivity, heat resistance, and mechanical strength were also realized, as in the case of the seventh embodiment.

Fifteenth Embodiment

The resist used in this embodiment is EBR-9 (manufactured by Toray Co.), a fluorine-included acrylic main chain scission type positive e-beam resist, and for 100 solid parts by weight of this resist, 10 parts by weight of a 4/1 mixture of fullerene $C_{60}$/fullerene $C_{70}$ (i.e., $C_{60/70}$ manufactured by Kanto Chemical Co.) were incorporated so as to form a resist material. After dissolving the fullerene $C_{60/70}$ in ortho-dichlorobenzene to have 1 wt % concentration, this solution was mixed into the above EBR-9 to make an EBR-9 resist solution including fullerene $C_{60/70}$. Then, a Si substrate was spin-coated with this resist solution, and an evaluation experiment similar to the seventh embodiment was performed. As a result, in the resist material according to the fifteenth embodiment, improvements of etching resistance, pattern contrast, sensitivity, heat resistance, and mechanical strength were also realized, as in the case of the seventh embodiment.

Sixteenth Embodiment

The resist used in this embodiment is ZEP-AC134 (manufactured by Nippon Zeon Co.), a chemical amplification positive e-beam resist, and for 100 solid parts by weight of this resist, 10 parts by weight of fullerene $C_{60}$ (manufactured by Kanto Chemical Co.) were incorporated so as to form a resist material. After dissolving the fullerene $C_{60}$ in ortho-dichlorobenzene to have 1 wt % concentration, this solution was mixed into the above ZEP-AC134 to make a ZEP-AC134 resist solution including fullerene $C_{60}$. Then, a Si substrate was spin-coated with this resist solution, and an evaluation experiment similar to the seventh embodiment was performed. As a result, in the resist material according to the sixteenth embodiment, improvements of etching resistance, pattern contrast, sensitivity, heat resistance, and mechanical strength were also realized, as in the case of the seventh embodiment. In the above sixth embodiment, sensitivity stabilization was shown with an example of a standard chemical amplification "negative" e-beam resist. In the present case of the chemical amplification "positive" e-beam resist according to the present invention, sensitivity stabilization could also be realized.

Seventeenth Embodiment

The resist used in this embodiment is chloromethylated polystyrene (CMS), a crosslinking type negative e-beam resist comprising a chloromethyl group, and for 100 solid parts by weight of this resist, 5 parts by weight of fullerene $C_{60}$ (manufactured by Kanto Chemical Co.) were incorporated so as to form a resist material. After dissolving the fullerene $C_{60}$ in ortho-dichlorobenzene to have 1 wt % concentration, this solution was mixed into the above CMS to make a CMS resist solution including fullerene $C_{60}$. Then, a Si substrate was spin-coated with this resist solution, and an evaluation experiment similar to the seventh embodiment was performed. As a result, in the resist material according to the seventeenth embodiment, improvements of etching resistance, heat resistance, and mechanical strength were also realized, as in the case of the seventh embodiment.

Eighteenth Embodiment

The resist used in this embodiment is RI-1210N (manufactured by Hitachi Chemical Co., Ltd.), a negative e-beam resist, and for 100 solid parts by weight of this resist, 5 parts by weight of fullerene $C_{60}$ (manufactured by Kanto Chemical Co.) were incorporated so as to form a resist material. After dissolving the fullerene $C_{60}$ in ortho-dichlorobenzene to have 1 wt % concentration, this solution was mixed into the above RI-1210N to make an RI-1210N resist solution including fullerene $C_{60}$. Then, a Si substrate was spin-coated with this resist solution, and an evaluation experiment similar to the seventh embodiment was performed. As a result, in the resist material according to the eighteenth embodiment, improvements of etching resistance, pattern contrast, sensitivity, heat resistance, and mechanical strength were also realized, as in the case of the seventh embodiment.

Nineteenth Embodiment

The resist used in this embodiment is a photoresist THMR-iP3300 (manufactured by Tokyo Ohka Kogyo Co.), and for 100 solid parts by weight of this resist, 7 parts by weight of fullerene $C_{60}$ (manufactured by Tokyo Kasei Co.) were incorporated so as to form a resist material. After dissolving the fullerene $C_{60}$ in ortho-dichlorobenzene to have 1 wt % concentration, this solution was mixed into the above THMR-iP3300 to make a THMR-iP$_{3300}$ resist solution including fullerene $C_{60}$. Then, a Si substrate was spin-coated with this resist solution, and an evaluation experiment similar to the seventh embodiment was performed using a reduction projection exposure tool. As a result, in the resist material according to the nineteenth embodiment, improvements of etching resistance, pattern contrast, sensitivity, heat resistance, and mechanical strength were also realized, as in the case of the seventh embodiment. In this nineteenth embodiment, the THMR-iP3300 resist which has generally been used in the exposure process for circuit patterns of the ULSI was used; however, the present invention may also be applied to all types of photoresists including a resist for the excimer laser. Furthermore, in addition to $C_{60}$, another fullerene or fullerene derivative, such as $C_{70}$ or $C_{60}H_{36}$ may also be used, as described above.

What is claimed is:

1. A method for fabricating a resist material, by repeatedly performing:

a first step of coating a substrate with a resist film; and a second step of depositing particles whose major component is a cluster of carbon atoms on the resist film.

2. A resist material having a resist and particles whose major component is a cluster of carbon atoms, wherein a resist film and the particles are alternatively deposited on a substrate.

* * * * *